US007079428B2

(12) United States Patent
Nygren

(10) Patent No.: US 7,079,428 B2
(45) Date of Patent: Jul. 18, 2006

(54) CIRCUIT FOR DISTRIBUTION OF AN INPUT SIGNAL TO ONE OR MORE TIME POSITIONS

(75) Inventor: Aaron Nygren, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/922,624

(22) Filed: Aug. 20, 2004

(65) Prior Publication Data

US 2005/0041484 A1 Feb. 24, 2005

(30) Foreign Application Priority Data

Aug. 20, 2003 (DE) .............................. 103 38 303

(51) Int. Cl.
*G11C 7/00* (2006.01)
(52) U.S. Cl. ...................................... 365/194; 365/233
(58) Field of Classification Search ..................... None
See application file for complete search history.

(56) References Cited

U.S. PATENT DOCUMENTS

| 3,824,562 | A | * | 7/1974 | Leibowitz et al. | .......... | 711/109 |
|---|---|---|---|---|---|---|
| 3,852,723 | A | * | 12/1974 | Wu | ............... | 365/174 |
| 4,815,113 | A | | 3/1989 | Ludwig et al. | ............... | 377/39 |
| 5,170,073 | A | | 12/1992 | Hahn et al. | ................. | 327/108 |
| 5,424,669 | A | | 6/1995 | Teggatz et al. | ............. | 327/270 |
| 5,621,698 | A | * | 4/1997 | Lee | ............. | 365/233 |
| 6,233,200 | B1 | * | 5/2001 | Knoll et al. | ................ | 365/233 |
| 6,366,149 | B1 | | 4/2002 | Lee et al. | .................... | 327/276 |
| 6,654,916 | B1 | | 11/2003 | Furukawa | ................... | 714/724 |
| 6,876,564 | B1 | * | 4/2005 | Kwon et al. | ................. | 365/63 |

* cited by examiner

*Primary Examiner*—Tan T. Nguyen
(74) *Attorney, Agent, or Firm*—Dicke, Billig & Czaja, PLLC

(57) ABSTRACT

A control circuit and memory including the control circuit are described herein. The control circuit provides for controlling the edge gradient of transmission signals which are produced by transmission drivers in an integrated circuit, with each transmission signal being produced by a number of series-connected stages of transmission driver amplifiers, whose combined impedance, which is selected by the control circuit, determines the edge gradient of the transmission signal. The control circuit includes a clock signal synchronization unit and a transmission signal distribution unit.

26 Claims, 2 Drawing Sheets

CIRCUIT FOR DISTRIBUTION OF AN INPUT SIGNAL TO ONE OR MORE TIME POSITIONS

CROSS-REFERENCE TO RELATED APPLICATIONS

This Utility Patent Application claims priority to German Patent Application No. DE 103 38 303.4 filed on Aug. 20, 2003, which is incorporated herein by reference.

FIELD OF INVENTION

The invention relates to a circuit arrangement which switches an input signal, which is received via a line, to one or more time positions depending on a distribution control signal, and emits it on one or more output line or lines corresponding to this time position or these time positions, and to the use of this circuit arrangement in a semiconductor memory system.

BACKGROUND

In very high-speed communications systems, which transmit signals at a high frequency, the edge gradient of signals which are produced by transmission drivers from integrated circuits have to comply with specific requirements. This is because the edge gradient of a signal influences at least two major performance features of the communications system. The two major performance features are the signal integrity and the receiver delay. The signal integrity is the governing factor for a function of the quotient dI/dt of the signal and which is itself influenced by parasitic inductances that occur in integrated circuit chips. The receiver delay is influenced by the trigger time for the received signal, which is dependent on the edge gradient. These two factors play a major role in the restriction of the transmission speed between a transmitter and a receiver. It is therefore necessary to stabilize the edge gradient of transmitted signals, in particular of high-power signals which are produced from integrated circuits, with respect to process, voltage and temperature variations and, furthermore, to scale the edge gradient on the basis of the transmission frequency (higher frequencies require proportionally steeper edges).

In many such communications systems, the edge gradient of transmission signals is controlled by two typical methods: according to one method, preamplifier nodes are loaded with resistance/capacitance elements in order in this way to limit the rate at which the output driver amplifiers are switched on and off via their gate. A second method is to in each case switch on some of a number of series-connected amplifier stages, such that the speed at which the transmission driver reaches its full driver level is regulated or controlled. The first method mentioned is based on fixed RC time constants for the preamplifier, and is thus subject to the problem that these time constants vary with the process parameters, with the operating voltage and with the temperature. The second method likewise uses RC time constants for time control between the stages, or else the stage/gate delay, neither of which is stable with respect to process parameter, voltage and temperature fluctuations.

A major disadvantage of the known methods is thus that they cannot keep the edge gradient of transmission signals constant with respect to fluctuations in the process parameters, e.g., the operating voltages and the temperature, nor do they offer any means whatsoever for dynamic scaling of the edge gradient as a function of changing frequencies.

SUMMARY

The present invention provides a control circuit and a semiconductor memory including the control circuit. In one embodiment, the present invention provides a control circuit for controlling the edge gradient of transmission signals which are produced by transmission drivers in an integrated circuit, with each transmission signal being produced by a number of series-connected stages of transmission driver amplifiers, whose combined impedance, which is selected by the control circuit, determines the edge gradient of the transmission signal, and with the control circuit having: a clock signal synchronization unit which produces a basic delay time which is dependent on the period duration of a clock signal, and converts this to a control signal which corresponds to it, and a transmission signal distribution unit, which delays the transmission signal by a number of delay times which are each determined by a distribution control signal which is supplied to it and by the control signal which is supplied to it, and distributes them in a corresponding manner to the respective stages of the transmission driver amplifiers.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
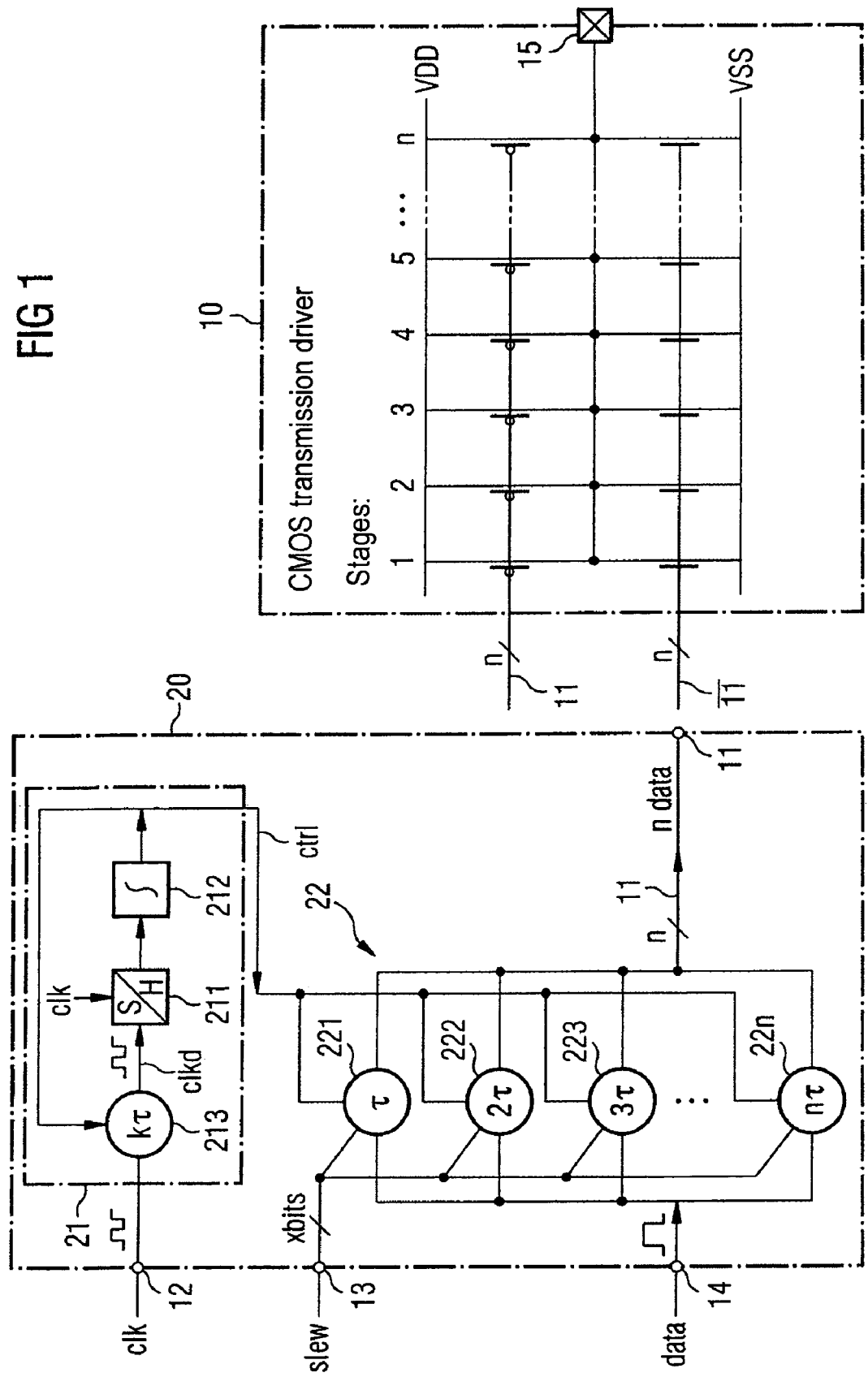
FIG. 1 is a schematic diagram illustrating one exemplary embodiment of a circuit arrangement according to the invention.

FIG. 1 is a diagram illustrating one embodiment of a circuit according to the invention. The circuit is contained in a control circuit for controlling the edge gradient of a transmission signal block 10, which is illustrated on the right in FIG. 1, is an integrated CMOS transmission driver in the exemplary embodiment, which comprises n series-connected stages 1–n of CMOS transmission driver amplifiers. In order to set the desired edge gradient for the transmission signal which is produced from an output pin 15 of the integrated circuit, for example a direct random access memory, one or more stages of the transmission driver 10 are selected in that time period, with the edge gradient of the transmission signal being determined by the combined impedance of the CMOS transmission driver. For this purpose, the gates of the individual stages 1–n of the transmission driver 10 are supplied via drive lines 11 in n-times form with gate drive signals from the control circuit 20 according to the invention, illustrated on the left in FIG. 1.

Control circuit 20 comprises two units: a clock signal synchronization unit 21 and a transmission signal distribution unit 22. The function of the control circuit 20 is to distribute the transmission signal "data", which is input to it via an input line 14, over the time period as a function of a clock signal "clk", which is input via an input line 12, and of a distribution control signal "slew", which is input via input lines 13 which comprise X bits.

A delay line 213 in the clock signal synchronization unit 21 delays the clock signal clk by a basic delay k·τ in order to form a delayed clock signal clkd. This delayed clock signal clkd is sampled by a sample and hold circuit 211 by the (undelayed) clock signal clk, and the sample value is integrated by an integrator 212, which uses this to produce an analog control signal "ctrl". The clock signal synchronization unit 21 is, fundamentally, a synchronous delay line, as has been described, by way of example, in the IEEE Journal of Solid State Circuit, Volume SC-20, No. 6, December 1985 on pages 1265–1271, entitled: "A novel precision MOS synchronous delay line" by Mel Bazes, and as is contained in integrated DRAM modules from Intel with the type designations 8207 and 8208.

In the clock signal synchronization unit 21, the delay line 213, the sample and hold circuit 211 and the integrator 212 which is connected downstream from it produce the analog control signal ctrl, which is fed back to the delay line 213, which produces the basic delay k·τ, for synchronization of the delayed clock signal clkd to the undelayed clock signal clk. This synchronization process is illustrated graphically in parts A and B of the signal timing diagram shown in FIG. 2. If the process parameters, operating voltage and temperature change, control signal ctrl which is fed back to the delay line 213 produces the basic delay k·τ, which is equal to μ·T, where μ·T is a multiple of the clock period T such that k·τ remains constant. As the period duration T of the clock signal clk varies, the analog voltage of the control signal ctrl also varies such that k·τ is always equal to μ·T.

It is noted here that the synchronous delay line which is used for the clock signal synchronization unit 21 in the exemplary embodiment is only one of a number of possible solutions, because it is also possible to use a delay line DLL which has feedback with a rigid delay, or else a PLL, which has feedback with a rigid phase. The major feature is that the clock signal synchronization unit 21 delays the clock signal, which is input via the line 12, as a function of the clock frequency, and emits a control signal ctrl which compensates for process parameter, voltage and temperature fluctuations. In the case of the exemplary embodiment, the control signal ctrl is an analog voltage, although it may also be a digital signal in variants which are not illustrated.

The transmission signal distribution unit 22 receives the transmission signal data on the input side via the line 14, and receives X bits of the distribution control signal slew via the lines 13. Furthermore, the transmission signal distribution unit 22 is supplied as an analog voltage with the control signal ctrl that is produced by the clock signal synchronization unit 21. The transmission signal distribution unit has a number of delay circuits 221, 222, 223, . . . 22n, which each delay the transmission signal data supplied to the input by the respective delay times τ, 2τ, 3τ, . . . , nτ, to be precise as a function of the X bits of the distribution control signal slew, and the control signal ctrl.

It should be mentioned here that the synchronous delay line which is described in the document mentioned above may not be used directly for the delay circuits 221–22n because it may not handle random data (because it is excited with a continuously running clock signal) and because the delay times which can be tapped off at the various tapping points on the known synchronous delay line are in each case too long for the function desired here. This is because the delay times τ to n·τ of the delay circuits 221–22n in the transmission signal distribution unit 22 are shorter than each stage or gate delay. The arrangement of the delay circuits 221–22n as shown in FIG. 1 results in the delay τ between the n bits which are provided via the multiple at the output connection 11 being a factor of k·τ, and, furthermore, in each case being set by the distribution control signal slew via the X bits. The transmission signal data experiences a delay, which is matched via the control signal ctrl to the basic delay k·τ, for each value of the distribution control signal slew.

The discrete delay circuits 221–22n, the number n of which matches the number of stages in the CMOS transmission driver 10, use a variable capacitance, which is varied by the control signal ctrl. The respective delay in the transmission signal distribution unit 22 is a function of the number of variable capacitances which are used and of the analog voltage which is supplied as the control signal ctrl. The respective number of variable capacitances, that is to say the number of delay circuits 221–22n by which the input transmission signal data is delayed, is governed by the X bits of the distribution control signal slew. Since the control signal ctrl is a function of process parameters, of the operating voltage and of the temperature, and possibly of a reference frequency, the transmission signal distribution unit likewise regulates or controls the time distribution of the delayed transmission signal n data, which is emitted via the n-times at the connection 11, as a function of process parameters, of the operating voltage, of the temperature and possibly of a reference frequency.

Figure 3:
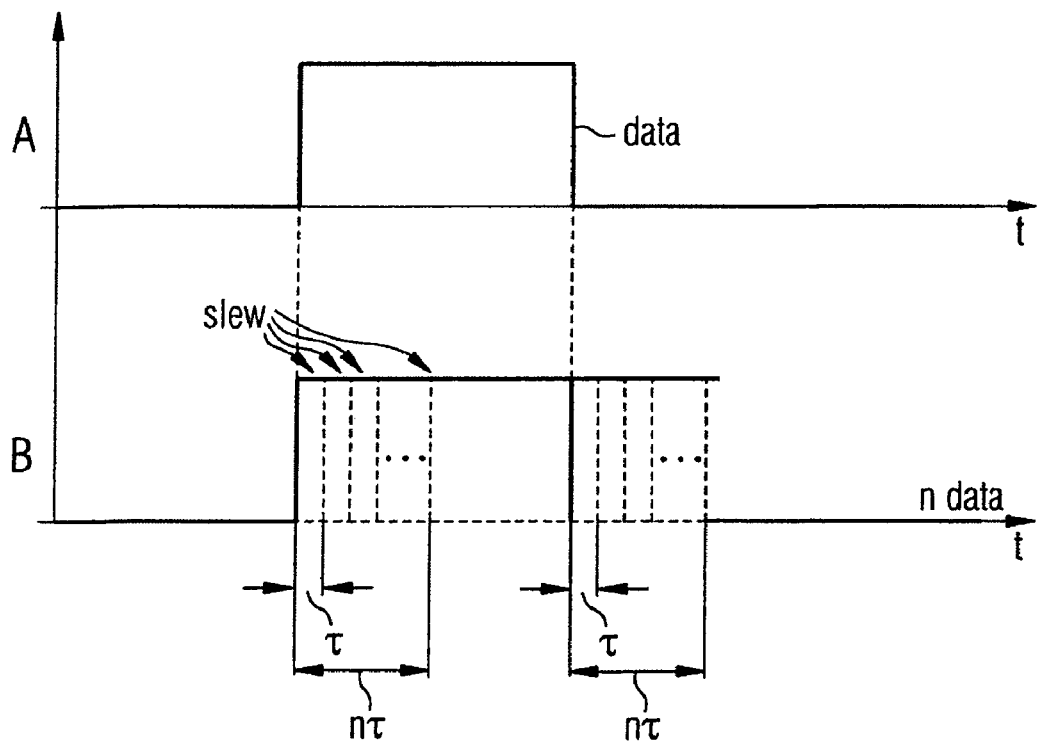
FIG. 3 is a signal timing diagram illustrating a signal distribution function of the transmission signal distribution unit.

FIG. 3 illustrates at Parts A and B, respectively, the input transmission signal data and the distribution (which is produced by the transmission signal distribution unit 22 on the basis of the distribution control signal slew) in n time positions, plotted against the distributed transmission signal n data which is emitted n-times at the connection 11 to the CMOS transmission driver 10.

One preferred application for the control circuit according to the invention is in modules of a semiconductor memory system, for example, in direct random access memory modules, memory controllers, etc., wherever it is necessary to set or control the edge gradient of transmission signals that are produced from a chip so as to compensate for the process parameter, operating voltage and temperature fluctuations, and possibly as a function of frequency. These transmission signals may, for example, be data signals, command signals and/or address signals.

Figure 2:
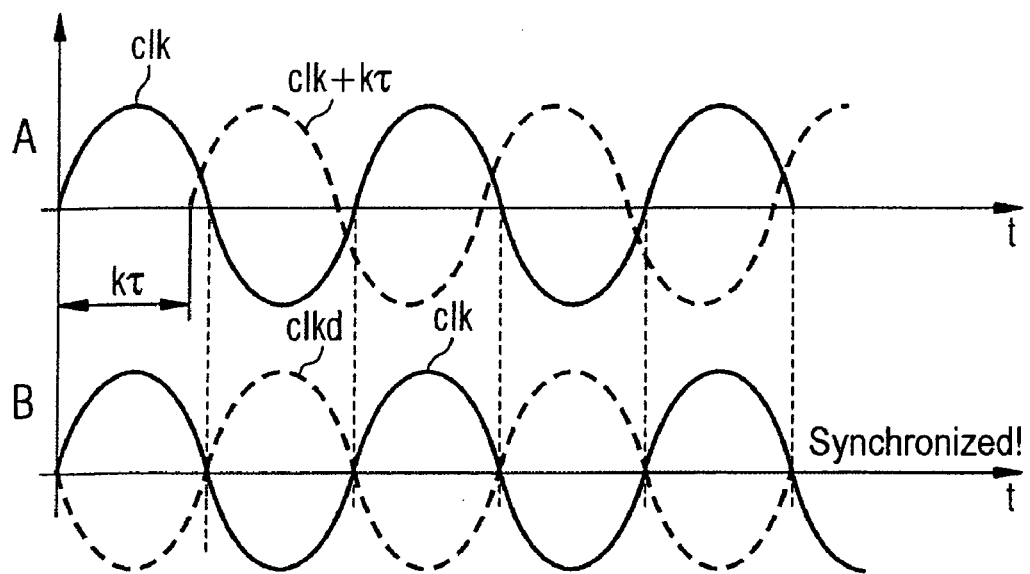
FIG. 2 is a signal timing diagram illustrating a synchronization function of the clock signal synchronization unit.

The present invention makes it possible to produce a circuit arrangement which switches an input signal, which is received via a line, to one or more time positions depending on a distribution control signal, and emits it on one or more output line or lines corresponding to this time position or these time positions, such that problems which have described above and which occur with the prior art can be avoided, and the circuit arrangement according to the invention can be used in a control circuit which can keep the edge gradient of transmission signals constant independently of fluctuations in the process parameters, in the operating voltage and in the temperature, and which also offers the capability for dynamic scaling of the edge gradient as a function of changing frequencies. A ring oscillator which contains a power amplifier comprising two or more stages is disclosed in FIG. 1 and in the associated description in column 2, line 30 to line 68 of U.S. Pat. No. 4,815,113, incorporated herein by reference, as is illustrated in FIG. 2 of that document. This power amplifier has a similar circuit design as other power amplifiers, which are not shown in FIG. 1, and is used in the ring oscillator as a circuit arrangement which emits pulses whose edge gradient can be adjusted by means of a control signal which is emitted from a left/right shift register via a multiple control line. The left/right shift register accordingly forms the transmission signal distribution unit in the known circuit arrangement, and in each case receives a control signal for shifting to the left or right from a comparator, depending on the comparison result (greater or less than). The transmission signal distribution unit, that is to say the shift register, does not, however, receive the signal that is present, for example, at the circuit node in the ring oscillator, and does not distribute it either, but, instead of this, enables or inhibits a number of stages in the power amplifier depending on the binary number in the shift register. Furthermore, the ring oscillator does not operate continuously but in intervals which are dependent on an enable or inhibit signal, which depends on the overflow of the first counter, which counts the signals emitted from the ring counter. On this basis, this document does not disclose either a clock signal synchronization unit or a transmission signal distribution unit according to the subject matter of this invention.

U.S. Pat. No. 5,424,669, incorporated herein by reference, describes a control circuit for controlling the edge gradient of transmission signals, which has a large number of parallel-connected resistance elements, each with a control element, by means of which the respective resistance element can be switched to the electrically conductive or electrically non-conductive state, having a delay circuit with optionally adjustable individual delay elements acting as signal distribution units. This document states that an adjustment circuit which drives the individual delay elements can adjust the delay time of each delay element either initially or on-line. However, this document does not describe the details of how this is done.

In order to avoid the problems as described above which occur in the prior art and to allow improved control of the edge gradient, such that this edge gradient can be adapted independently of process parameter, operating voltage and temperature fluctuations and can at the same time be matched to changing transmission frequencies, this invention uses a set of series-connected stages of transmission driver amplifiers for the transmission driver, in order to determine the edge gradient of the transmission signal by time-controlled adjustment of the driver level and/or of the driver impedance. In one embodiment, the difference from the prior art is the way in which the time information for the delay between the driver stages is determined.

According to one embodiment of the invention, a circuit arrangement which switches an input signal, which is received via a line, to one or more time positions depending on a distribution control signal, and emits it on one or more output line or lines corresponding to this time position or these time positions, is accordingly distinguished in that the circuit arrangement has: a clock signal synchronization unit which produces a basic delay time which is dependent on the period duration of a clock signal, and converts this to a control signal which corresponds to it, and a signal distribution unit, which has two or more discrete delay stages which in each case delay the input signal that is input to them by a specific delay time, which is respectively associated with them, corresponding to the distribution control signal which is supplied to them and to the control signal which is supplied to them, so that the respective time position or time positions of the input signal which has been delayed in this way is or are related in a specific manner to the basic delay time of the clock signal synchronization unit, and emits the delayed input signal repeatedly via the output lines.

The circuit arrangement according to the invention accordingly compensates for the edge gradient of the transmission signals at a given frequency, and thus results in the edge gradient being independent of process parameter, voltage and temperature fluctuations. In addition, the control circuit allows the edge gradient to be scaled as a function of the frequency.

A synchronous delay line (SDL), which produces the basic delay time as an integer multiple of the period duration of the clock signal, and produces the control signal as an analog voltage signal, can be used for the clock signal synchronization unit. Instead of a synchronous delay line such as this, it is likewise possible to use a delay line (DLL) whose delay is rigidly controlled, or else a delay line (PLL) whose phase is rigidly controlled.

In addition to the synchronous delay line (SDL) which is used, the clock signal synchronization unit in the exemplary embodiment has a sample and hold circuit as well as an integrator circuit, which is connected downstream from the sample and hold circuit and emits the control signal. In this case, the sample and hold circuit is clocked by the clock signal, which it uses to sample the clock signal delayed by the basic delay time, which it holds. The integrator circuit uses the time difference between the clock signal and the clock signal delayed in this way to produce the control signal, which is fed back as a feedback signal to the delay line that produces the basic delay time. The transmission signal distribution unit, which receives the control signal and the distribution control signal, as well as the transmission signal on the input side, has two or more delay stages with different discrete delay times, which distribute the transmission signal on the basis of the clock frequency and of the distribution control signal over the time periods which are determined by the number and the individual delay times of the discrete delay stages. In this case, the number of delay stages corresponds to the number of transmission driver amplifier stages, and each delay time which is given to the input transmission signal by the discrete delay stages is in each case specifically related to the basic delay time of the clock signal synchronization unit.

In this case, the discrete delay stages in the transmission signal distribution unit may be designed such that the difference between the delay times of adjacent delay stages is in each case the same.

According to another embodiment of the invention, a semiconductor memory system is specified, which uses the already-described control circuit according to the invention, to be precise integrated in semiconductor memory chips and/or controller chips. The transmission signals are, in particular, data and/or command and/or address signals for the semiconductor memory system.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory system comprising;
a semiconductor memory; and
a circuit comprising a clock signal synchronization unit for receiving clock signal and producing a control signal, and a signal distribution unit for switching an input signal to one or more time positions depending on the control signal and a distribution control signal, including providing a signal on one or more output lines corresponding to the time positions, wherein the input signals are one of data signal and address signals.

2. A circuit comprising:
a clock signal synchronization unit for receiving a clock signal, producing a delay time dependent on the period duration of the clock signal, and producing a control signal using the delay time ; and
a signal distribution unit for switching a input signal to one or more time positions depending on the control signal and a separately supplied distribution control signal, including providing the signal on one or more output lines corresponding to the time positions.

3. The circuit of claim 2, wherein the signal distribution unit includes two or more discrete delay stages, that in each discrete delay stage delays the input signal that is input to them by a specific delay time, that is respectively associated with them, corresponding to the distribution control signal which is supplied to them and to the control signal which is supplied to them.

4. The circuit of claim 2, further comprising:
a transmission driver amplifier, wherein the output signal is produced on one or more output lines, and the output lines are connected with one stage of two or more series-connected driver stages of a transmission driver amplifier.

5. A circuit which switches an input signal, which is received via a line, to one or more time positions depending on a distribution control signal, and emits it on one or more output line or lines corresponding to this time position or these time positions, the circuit comprising:
a clock signal synchronization unit which produces a basic delay time dependent on the period duration of a clock signal, and converts the basic delay time to a control signal which corresponds to it; and
a signal distribution unit, which has two or more discrete delay stages which in each case delay the input signal that is input to them by a specific delay time, which is respectively associated with them, corresponding to the distribution control signal which is supplied to them and to the control signal which is supplied to them, so that the respective time position or time positions of the input signal which has been delayed in this way is or are related in a specific manner to the basic delay time of the clock signal synchronization unit, and emits the delayed input signal as a multiplexed signal via the output lines.

6. The circuit of claim 5, wherein the output lines are respectively connected with one stage of two or more series-connected driver stages of a transmission driver amplifier, the number of which is determined by the by a circuit arrangement corresponding to the respective time position of the delayed input signal which is emitted via the output lines, determines a combined impedance of the driver stages of the transmission driver amplifier, and hence an edge gradient of the transmission signal which is transmitted from the transmission driver amplifier.

7. The circuit of claim 6, wherein the clock signal synchronization unit has a synchronous delay line, which produces the basic delay time as an integer multiple of the period duration of the clock signal, and produces the control signal as an analog voltage signal.

8. The circuit arrangement as claimed in claim 7, wherein the clock signal synchronization unit also has a sample and hold circuit and an integrator circuit which emits the control signal, with the sample and hold circuit sampling and holding the clock signal, which has been delayed by the basic delay time, being clocked by the clock signal, and the integrator circuit using the time difference between the clock signal and the delayed clock signal to produce the control signal, which is fed back as a feedback signal to the delay line which produces the basic delay time.

9. The circuit of claim 7, wherein the number of delay circuits in the transmission signal distribution unit matches the number of transmission driver amplifier stages.

10. The circuit of claim 9, wherein the discrete delay circuits are designed such that the difference between each of their delay times is the same, so that their ratio in each case has the same offset with respect to the basic delay time.

11. The circuit of claim 5, wherein the clock signal synchronization unit produces the control signal as a function of specific process parameters during the processing in the integrated circuit.

12. The circuit arrangement of claim 5, wherein the clock synchronization unit produces the control signal as a function of an operating voltage for the integrated circuit.

13. The circuit arrangement of claim 5, wherein the clock signal synchronization unit produces the control signal as a function of a temperature of the integrated circuit.

14. The circuit of claim 5, wherein the clock signal synchronization unit produces the control signal as a function of a reference frequency for the clock signal.

15. A semiconductor memory system comprising:
a semiconductor memory; and
a circuit that switches an input signal, which is received via a line, to one or more time positions depending on a distribution control signal, and emits it on one or more output line or lines corresponding to this time position or these time positions, the circuit comprising a clock signal synchronization unit which produces a basic delay time dependent on the period duration of a clock signal, and converts this to a control signal which corresponds to it; and a signal distribution unit, which has two or more discrete delay stages which in each case delay the input signal that is input to them by a specific delay time, which is respectively associated with them, corresponding to the distribution control signal which is supplied to them and to the control signal which is supplied to them, so that the respective time position or time positions of the input signal which has been delayed in this way is or are related in a specific manner to the basic delay time of the clock signal synchronization unit, and emits the delayed input signal as a multiplexed signal via the output lines.

16. The semiconductor memory system of claim 15, wherein said circuit is integrated in at least one of a semiconductor memory circuit and a controller circuit, wherein the output lines are respectively connected with one stage of two or more series-connected driver stages of a transmission driver amplifier, the number of which is determined by the circuit arrangement corresponding to the respective time position of the delayed input signal which is emitted via the output lines, determines a combined impedance of the driver stages of the transmission driver amplifier, and hence an edge gradient of the transmission signal which is transmitted from the transmission driver amplifier; and the transmission signal comprises one of a data signal, a command signal, and an address signal of the semiconductor memory system.

17. The semiconductor memory system of claim 15, wherein the clock signal synchronization unit has a synchronous delay line, which produces the basic delay time as an integer multiple of the period duration of the clock signal, and produces the control signal as an analog voltage signal.

18. The semiconductor memory system of claim 17, wherein the clock signal synchronization unit also has a sample and hold circuit and an integrator circuit which emits the control signal, with the sample and hold circuit sampling and holding the clock signal, which has been delayed by the basic delay time, being clocked by the clock signal, and the integrator circuit using a time difference between the clock signal and the delayed clock signal to produce the control signal, which is fed back as a feedback signal to the delay line which produces the basic delay time.

19. The semiconductor memory system of claim 17, wherein the number of delay circuits in the signal distribution unit matches the number of transmission driver amplifier stages.

20. The semiconductor memory system of claim 19, wherein the discrete delay circuits are designed such that the difference between each of their delay times is the same, so that their ratio in each case has the same offset with respect to the basic delay time.

21. The semiconductor memory system of claim 15, wherein the clock signal synchronization unit produces the control signal as a function of specific process parameters during the processing in the integrated circuit.

22. The semiconductor memory system of claim 15, wherein the clock synchronization unit produces the control signal as a function of an operating voltage for the integrated circuit.

23. The semiconductor memory system of claim 15, wherein the clock signal synchronization unit produces the control signal as a function of a temperature of the integrated circuit.

24. The semiconductor memory system of claim 15, wherein the clock signal synchronization unit produces the control signal as a function of a reference frequency for the clock signal.

25. A circuit that switches an input signal, which is received via a line, to one or more time positions depending on a distribution control signal, and emits it on one or more output line or lines corresponding to this time position or these time positions, the circuit comprising:

a clock signal synchronization unit which produces a basic delay time dependent on the period duration of a clock signal, and converts this to a control signal which corresponds to it; and a signal distribution unit, which has two or more discrete delay stages which in each case delay the input signal that is input to them by a specific delay time, which is respectively associated with them, corresponding to the distribution control signal which is supplied to them and to the control signal which is supplied to them, so that the respective time position or time positions of the input signal which has been delayed in this way is or are related in a specific manner to the basic delay time of the clock signal synchronization unit, and emits the delayed input signal repeatedly via the output lines, wherein the output lines are in each case connected with one stage of two or more series-connected driver stages of a transmission driver amplifier, the number of which is determined by the by the circuit arrangement corresponding to the respective time position of the delayed input signal which is emitted via the output lines, determines the combined impedance of the driver stages of the transmission driver amplifier, and hence the edge gradient of the transmission signal which is transmitted from the transmission driver amplifier.

26. The circuit of claim 25, wherein the clock signal synchronization unit has a synchronous delay line, which produces the basic delay time as an integer multiple of the period duration of the clock signal, and produces the control signal as an analog voltage signal, and wherein the clock signal synchronization unit also has a sample and hold circuit and an integrator circuit which emits the control signal, with the sample and hold circuit sampling and holding the clock signal, which has been delayed by the basic delay time, being clocked by the clock signal, and the integrator circuit using the time difference between the clock signal and the delayed clock signal to produce the control signal, which is fed back as a feedback signal to the delay line which produces the basic delay time.

* * * * *